(12) United States Patent
Pickel et al.

(10) Patent No.: US 11,729,898 B1
(45) Date of Patent: Aug. 15, 2023

(54) CIRCUIT BOARD CONNECTOR FOOTPRINT

(71) Applicant: TE Connectivity Solutions GmbH, Schaffhausen (CH)

(72) Inventors: Justin Dennis Pickel, Hummelstown, PA (US); Margaret Mahoney Fernandes, West Chester, PA (US); Timothy Robert Minnick, Enola, PA (US)

(73) Assignee: TE CONNECTIVITY SOLUTIONS GMBH, Schaffhausen (CH)

( * ) Notice: Subject to any disclaimer, the term of this patent is extended or adjusted under 35 U.S.C. 154(b) by 0 days.

(21) Appl. No.: 17/831,859

(22) Filed: Jun. 3, 2022

(51) Int. Cl.
| H05K 1/11 | (2006.01) |
| H05K 1/02 | (2006.01) |
| H01R 12/58 | (2011.01) |
| H05K 1/18 | (2006.01) |

(52) U.S. Cl.
CPC .......... *H05K 1/0222* (2013.01); *H05K 1/116* (2013.01); *H01R 12/58* (2013.01); *H05K 1/18* (2013.01); *H05K 2201/09481* (2013.01); *H05K 2201/09609* (2013.01); *H05K 2201/09772* (2013.01); *H05K 2201/10189* (2013.01); *H05K 2201/10901* (2013.01)

(58) Field of Classification Search
CPC ................................................. H05K 1/11–116
See application file for complete search history.

(56) References Cited

U.S. PATENT DOCUMENTS

2015/0014045 A1 * 1/2015 Brigham ................ H05K 1/115
174/266

* cited by examiner

*Primary Examiner* — Jeremy C Norris

(57) ABSTRACT

A printed circuit board includes a layered substrate having a plurality of layers having an electrical connector footprint configured to receive an electrical connector. The printed circuit board includes pair anti-pads passing through the layered substrate around pairs of signal vias. The printed circuit board includes ground vias passing through the layered substrate. The ground vias are configured to receive ground pins of the electrical connector. The ground vias are located outside of the pair anti-pads. The printed circuit board includes SI vias passing through the layered substrate. The SI vias form an SI fence surrounding the corresponding pair anti-pad.

20 Claims, 3 Drawing Sheets

CIRCUIT BOARD CONNECTOR FOOTPRINT

BACKGROUND OF THE INVENTION

The subject matter herein relates generally to printed circuit boards.

Printed circuit boards include signal vias and ground vias for connection of an electrical connector to the printed circuit board. The printed circuit boards have ground planes that provide shielding for the signal vias and signal traces routed through the printed circuit boards. However, as signaling speeds increase, signal integrity degrades.

A need remains for improved circuit board footprint designs having improved electrical performance at high speeds.

BRIEF DESCRIPTION OF THE INVENTION

In one embodiment, a printed circuit board is provided and includes a layered substrate having a plurality of layers including a top layer, a bottom layer, and at least one middle layer. The layered substrate has an electrical connector footprint configured to receive an electrical connector. The printed circuit board includes pair anti-pads passing through the layered substrate. The printed circuit board includes signal vias passing through the layered substrate. The signal vias are configured to receive signal pins of the electrical connector. The signal vias are arranged in pairs. The pairs of signal vias are located in corresponding pair anti-pads. The printed circuit board includes ground vias passing through the layered substrate. The ground vias are configured to receive ground pins of the electrical connector. The ground vias are located outside of the pair anti-pads. The printed circuit board includes SI vias passing through the layered substrate. The SI vias form an SI fence surrounding the corresponding pair anti-pad.

In another embodiment, a printed circuit board is provided and includes a layered substrate having a plurality of layers including a top layer, a bottom layer, and at least one middle layer. The layered substrate has an electrical connector footprint configured to receive an electrical connector. The printed circuit board includes pair anti-pads passing through the layered substrate. The printed circuit board includes signal vias passing through the layered substrate. The signal vias are configured to receive signal pins of the electrical connector. The signal vias arranged in pairs. The pairs of signal vias are located in corresponding pair anti-pads. The printed circuit board includes ground vias passing through the layered substrate. The ground vias are configured to receive ground pins of the electrical connector. The ground vias are located outside of the pair anti-pads. The printed circuit board includes SI vias passing through the layered substrate. The SI vias form an SI fence surrounding the corresponding pair anti-pad. The SI vias have an average SI via-SI via pitch between adjacent SI vias and the SI vias have an average SI via-signal via spacing between the SI via and the nearest signal via. The average SI via-signal via spacing is at least twice the average SI via-SI via pitch.

In a further embodiment, a printed circuit board is provided and includes a layered substrate having a plurality of layers including a top layer, a bottom layer, and at least one middle layer. The layered substrate has an electrical connector footprint configured to receive an electrical connector. The printed circuit board includes pair anti-pads passing through the layered substrate. Each pair anti-pad is oval-shaped having a first end, a second end opposite the first end, a first side extending between the first and second ends, and a second side opposite the first side. The first and second ends are curved. The printed circuit board includes signal vias passing through the layered substrate. The signal vias are configured to receive signal pins of the electrical connector. The signal vias are arranged in pairs. The pairs of signal vias are located in corresponding pair anti-pads. The printed circuit board includes ground vias passing through the layered substrate. The ground vias are configured to receive ground pins of the electrical connector. The ground vias are located outside of the pair anti-pads. The printed circuit board includes SI vias passing through the layered substrate. The SI vias form an SI fence surrounding the corresponding pair anti-pad. At least three of the SI vias are arranged along the first end of the corresponding pair anti-pad and at least three of the SI vias are arranged along the second end of the corresponding pair anti-pad.

DETAILED DESCRIPTION OF THE INVENTION

Figure 1:
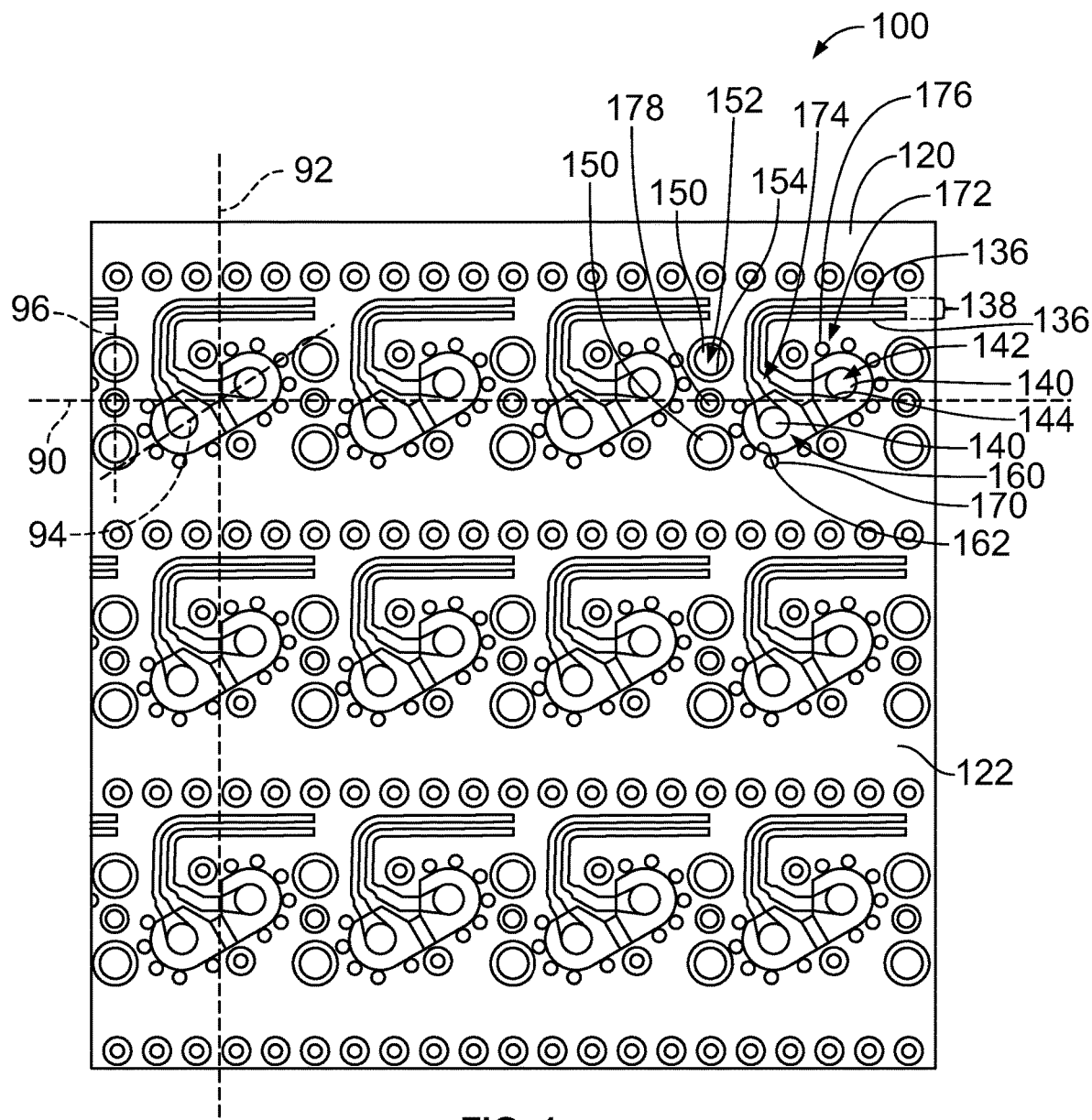
FIG. 1 is a top view of a printed circuit board in accordance with an exemplary embodiment.
Figure 2:
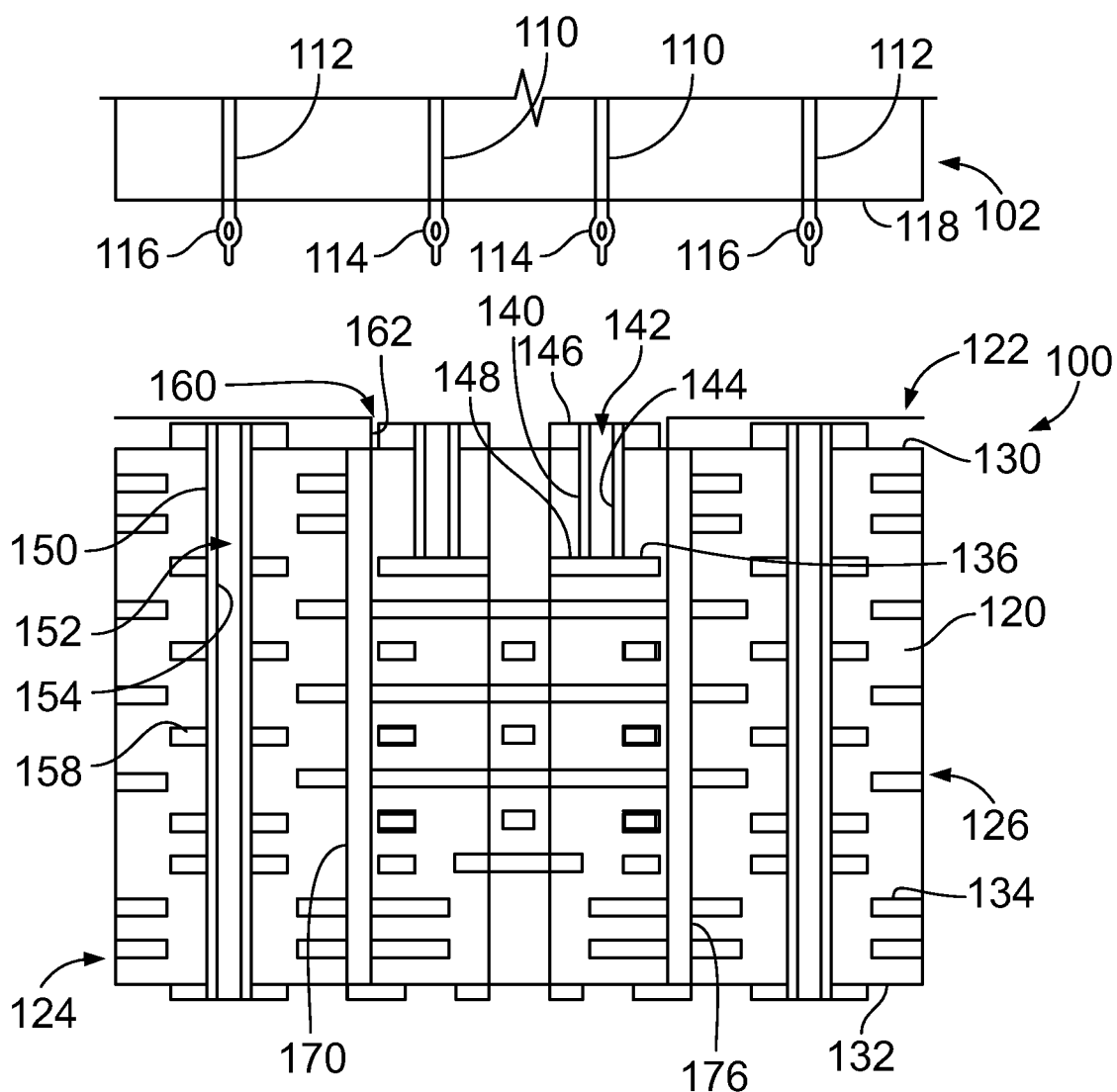
FIG. 2 is a cross-sectional view of a portion of the printed circuit board in accordance with an exemplary embodiment.

FIG. 1 is a top view of a printed circuit board 100 in accordance with an exemplary embodiment. FIG. 2 is a cross-sectional view of a portion of the printed circuit board 100 in accordance with an exemplary embodiment. The printed circuit board 100 is configured to receive an electrical connector 102 (FIG. 2). For example, the electrical connector 102 may be press-fit on to the printed circuit board 100. In various embodiments, the electrical connector 102 is a high speed electrical connector, such as a high speed backplane connector. Optionally, the electrical connector 102 may support aggregate data rates of 224 Gbps, for example. The electrical connector 102 may operate at high frequency, such as up to 120 GHz.

The electrical connector 102 includes a plurality of signal contacts 110 for data transmission. In various embodiments, the signal contacts 110 are arranged in pairs, such as to convey differential signals. In an exemplary embodiment, the electrical connector 102 includes a plurality of ground contacts 112 provide electrical shielding for the signal contacts 110. The electrical connector 102 includes signal pins 114 at ends of the signal contacts 110 and ground pins 116 at ends of the ground contacts 112. The signal pins 114 and the ground pins 116 are provided at a bottom 118 of the electrical connector 102 within a footprint of the electrical connector 102. The signal pins 114 and the ground pins 116 are configured to be electrically connected to the printed circuit board 100. For example, the signal pins 114 and the ground pins 116 may be press-fit into the printed circuit board 100. In various embodiments, the signal pins 114 and the ground pins 116 are compliant pins, such as eye-of-the-needle pins. The signal pins 114 and the ground pins 116 may be arranged in an array, such as a plurality of rows and a plurality of columns along the bottom 118 of the electrical connector 102.

The printed circuit board 100 includes a layered substrate 120 having a plurality of layers and electrical circuits formed on one or more of the layers. With reference to FIG. 2, the layered substrate 120 includes a top layer 122 at an upper surface 130 of the printed circuit board 100. The layered substrate includes a bottom layer 124 at a lower surface 132 of the printed circuit board 100. The layered substrate 120 includes one or more middle layers 126 between the top layer 122 and the bottom layer 124. The printed circuit board 100 includes one or more ground planes 134 on one or more of the layers of the layered substrate 120. The printed circuit board 100 includes signal traces 136 on one or more of the layers of the layered substrate 120. The signal traces 136 are generally routed through signal trace areas 138 of the printed circuit board 100 (for example, areas between rows of signal vias). The ground planes 134 provide electrical shielding for the signal traces 136 routed through the printed circuit board 100.

The printed circuit board 100 includes signal vias 140 passing through the layered substrate 120. The signal vias 140 may be plated through holes. In an exemplary embodiment, the signal vias 140 are arranged in pairs. The pairs of signal vias 140 may be arranged in a predetermined pin out or pattern along the printed circuit board 100 corresponding to the arrangement of signal pins 114 of the electrical connector 102. In various embodiments, the signal vias 140 may be arranged in a plurality of rows and/or a plurality of columns. The rows extend along primary axes 90 and the columns extend along secondary axes 92. In various embodiments, the pairs of signal vias 140 may be aligned along the primary axes 90 and/or along the secondary axes 92. In other various embodiments, the pairs of signal vias 140 may be staggered along the primary axes 90 and/or along the secondary axes 92. In an exemplary embodiment, the signal vias 140, within each pair, extend along a signal pair axis 94 angled relative to the primary and secondary axes 90, 92. For example, the signal vias 140 may be arranged at approximately 45° relative to the axes 90, 92. However, the signal pair axis 94 may be at any angle relative to the axes 90, 92. Angling the signal vias 140 along the signal pair axis 94 allows tighter spacing or pitch between the pairs of signal vias 140.

Each signal via 140 is defined by an opening or hole 142 bored through the printed circuit board 100. The signal via 140 includes a plating layer 144 along the interior surface of the hole 142. The signal via 140 may include a signal pad 146 at the top layer 122 at the upper surface 130 of the printed circuit board 100. The signal via 140 includes a takeoff pad 148 extending from the plating layer 144 to the signal trace 136. The takeoff pad 148 may be located at a layer other than the top layer 122, such as one of the middle layers 126 or the bottom layer 124. The signal via 140 is configured to receive the corresponding signal pin 114 of the electrical connector 102. For example, the signal pin 114 may be press-fit into the signal via 140 to electrically connect the signal pin 114 to the plating layer 144. The takeoff pad 148 electrically connects the signal pin 114 and the plating layer 144 to the signal trace 136. In various embodiments, the signal vias 140 are counterbored from the lower surface 132 such that the signal vias 140 do not extend the entire height of the printed circuit board 100. The signal vias 140 may be counterbored to an area just below the takeoff pad 148.

The printed circuit board 100 includes ground vias 150 passing through the layered substrate 120. The ground vias 150 may be plated through holes. The ground vias 150 are arranged in a predetermined pin out or pattern along the printed circuit board 100 corresponding to the arrangement of ground pins 116 of the electrical connector 102. In various embodiments, the ground vias 150 may be arranged in a plurality of rows and/or a plurality of columns. In an exemplary embodiment, the ground vias 150 are arranged in pairs, with pairs of the ground vias 150 located between pairs of the signal vias 140. The pair of ground vias 150 extend along a ground pair axis 96. In an exemplary embodiment, the ground pair axes 96 are parallel to the secondary axes 92. However, the ground pair axes 96 may be angled relative to the primary and secondary axes 90, 92 in alternative embodiments.

Each ground via 150 is defined by an opening or hole 152 bored through the printed circuit board 100. The ground via 150 includes a plating layer 154 along the interior surface of the hole 152. The ground via 150 may include a ground pad at the top layer 122 at the upper surface 130 of the printed circuit board 100. Alternatively, the top layer 122 may define one of the ground planes 134 of the printed circuit board 100 substantially covering the upper surface 130 of the printed circuit board 100. The ground via 150 includes one or more takeoff pads 158 extending from the plating layer 154 to the one or more ground planes 134. The ground via 150 is configured to receive the corresponding ground pin 116 of the electrical connector 102. For example, the ground pin 116 may be press-fit into the ground via 150 to electrically connect the ground pin 116 to the ground plane 134 of the printed circuit board 100. The ground via 150 is configured to be electrically connected to the electrical connector 102 through the ground pin 116. In various embodiments, the ground vias 150 extend the entire height of the printed circuit board 100, such as from the upper surface 130 to the lower surface 132.

The printed circuit board 100 includes pair anti-pads 160 passing through the layered substrate 120. Each pair of signal vias 140 are located in a corresponding pair anti-pad 160. The pair anti-pad 160 is a void area defined around the pair of signal vias 140, which restricts placement of other circuits in the area of the pair anti-pad 160. For example, the ground planes 136 and the ground vias 150 are restricted from being located in the area of the pair anti-pad 160 to limit proximity of such ground circuits to the signal circuits. The pair anti-pad 160 is a void that prevents current from flowing along a path through the area of the pair anti-pad 160. The pair anti-pad 160 is a keep out area for circuits of the printed circuit board 100 other than the corresponding signal pair. In an exemplary embodiment, the pair anti-pad 160 is defined by an edge 162 of the ground plane 134. The dielectric material forming the layered substrate 120 may be located in the area of the pair anti-pad 160. The pair anti-pad 160 extends vertically through the layered substrate 120.

In an exemplary embodiment, the printed circuit board 100 includes a plurality of Signal Integrity (SI) vias 170 passing through the layered substrate 120. The SI vias 170 are electrically connected to the ground planes 136. In contrast to the ground vias 150, the SI vias 170 do not receive ground pins or any other structures from the electrical connector 102. In various embodiments, the SI vias 170 are smaller than the ground vias 150 (have smaller diameters). The SI vias 170 may be smaller than the ground vias 150 because the SI vias 170 are not designed to receive ground pins. In various embodiments, the SI vias 170 may be filled or solid rather than having an opening that receives a ground pin. The SI vias 170 improve signal integrity of the signal paths through the printed circuit board 100 to improve the ability of the signals to propagate through the printed circuit board 100 without distortion. The SI vias 170 are positioned in close proximity to the signal vias 140 to provide electrical shielding and reduce signal degradation, such as due to crosstalk, impedance discontinuities, signal attenuation, or other signal distortion. The SI vias 170 are tightly packed around the pair of signal vias 140 to create an SI fence 172 surrounding the pair of signal vias 140. In an exemplary embodiment, the SI vias 170 are located at the edge of the pair anti-pad 160 and substantially surrounds the pair anti-pad 160. The SI fence 172 may have a small gap 174 (area without SI vias 170) to allow the signal traces 136 to exit the pair anti-pad 160 from the signal vias 140. In various embodiments, the gap 174 is made as small as practical within general printed circuit board design and manufacture limits. For example, minimum spacing requirements between the SI vias 170 and the signal traces 136 are maintained. In various embodiments, the SI vias 170 extend the entire height of the printed circuit board 100, such as from the upper surface 130 to the lower surface 132.

In an exemplary embodiment, the printed circuit board 100 may include different types of SI vias 170. For example, a subset of the SI vias 170 may be referred to as anti-pad SI vias 176, which are located in very close proximity to the pair anti-pads 160. Another subset of the SI vias 170 may be referred to as board SI vias 178, which are located throughout the printed circuit board 100 at locations remote from the pair anti-pads 160. For example, the board SI vias 178 may be located in rows along the signal trace areas 138. The board SI vias 178 may be located at other locations. For example, in the illustrated embodiment, board SI vias 178 are located between the ground vias 150. Other locations are possible in alternative embodiments. The board SI vias 178 may be formed in the same way as the anti-pad SI vias 176, the difference being the location of the anti-pad SI vias 176 (adjacent the pair anti-pads 160) compared to the board SI vias 178 (remote from the pair anti-pads 160). In alternative embodiments, the anti-pad SI vias 176 may be formed differently than the board SI vias 178, such as having different diameters or being open holes versus filled holes.

Figure 3:
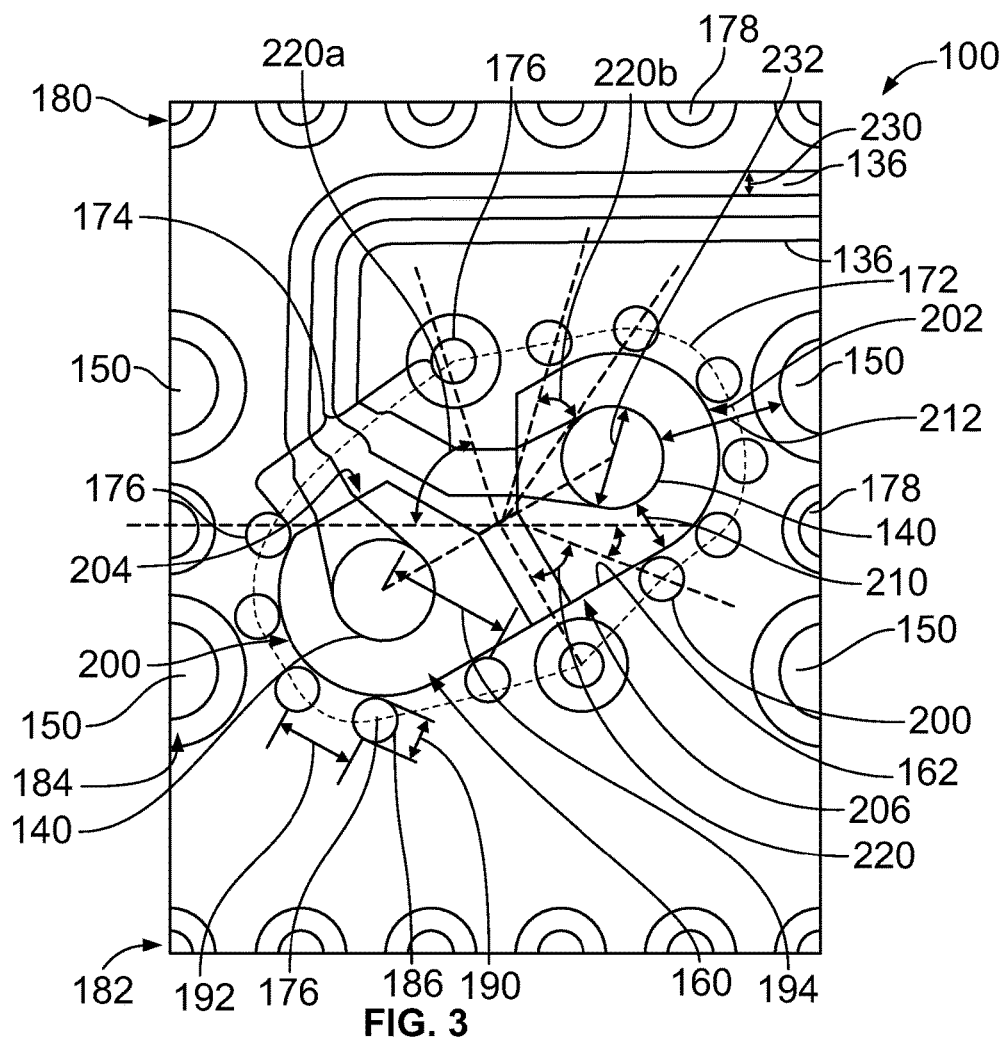
FIG. 3 is a top view of a portion of the printed circuit board in accordance with an exemplary embodiment.

FIG. 3 is a top view of a portion of the printed circuit board 100 in accordance with an exemplary embodiment. The printed circuit board 100 includes the pair of signal vias 140 in the pair anti-pad 160. The ground vias 150 are located at opposite sides of the signal vias 140 (right side and left side in the illustrated view) to provide electrical shielding between pairs of the signal vias 140. The board SI vias 178 are located around the pair anti-pad 160, such as forming an SI fence 180 above the pair of signal vias 140, an SI fence 182 below the pair of signal vias 140, and filling the spaces between the ground vias 150 to form ground fences 184 between pairs of the signal vias 140. The anti-pad SI vias 176 are used to improve signal integrity, such as compared to printed circuit boards that do not include the anti-pad SI vias 176.

In an exemplary embodiment, the anti-pad SI vias 176 (may be referred to hereinafter as simply SI vias 176) pass through the printed circuit board 100. The SI vias 176 are electrically connected to the ground plane(s) 136. In contrast to the ground vias 150, the SI vias 176 do not receive ground pins or any other structures from the electrical connector 102. In various embodiments, the SI vias 176 may be filled or solid rather than having an opening that receives a ground pin. The SI vias 176 improve signal integrity of the signal paths through the printed circuit board 100 to improve the ability of the signals to propagate through the printed circuit board 100 without distortion. The SI vias 176 are positioned in close proximity to the signal vias 140 to provide electrical shielding and reduce signal degradation, such as due to crosstalk, impedance discontinuities, signal attenuation, or other signal distortion.

The SI vias 176 are tightly packed around the pair of signal vias 140 to create the SI fence 172 surrounding the pair of signal vias 140. In an exemplary embodiment, the SI vias 176 are located at the edge of the pair anti-pad 160 and substantially surrounds the pair anti-pad 160. Each SI via 176 has an outer surface 186. In various embodiments, the outer surface 186 is provided at the edge 162 of the pair anti-pad 160. For example, the outer surfaces 186 of the SI vias 176 are positioned as close to the signal vias 140 as possible (for example, touching the anti-pad 160).

The SI via 176 has a central axis and a diameter 190. The SI vias 176 are spaced apart from each other by an SI via-SI via pitch 192 (measured between central axes). The SI via-SI via pitches 192 may be approximately equal between each of the SI vias 176, except for across the gap 174, which is wider than the SI via-SI via pitch 192 to allow the signal traces 136 to exit the pair anti-pad 160. The SI vias 176 have a small average SI via-SI via pitch 192. For example, the average SI via-SI via pitch 192 may be less than a signal via-signal-via spacing 194, which is the distance between the central axes of the signal vias 140. In various embodiments, the average SI via-SI via pitch 192 may be less than half the signal via-signal-via spacing 194. The average SI via-SI via pitch 192 may be less than an SI via-signal-via spacing 194, which is the distance between the central axes of the SI via 176 and the nearest signal via 140. In various embodiments, the SI via-signal-via spacing 194 may be approximately twice the average SI via-SI via pitch 192. The average SI via-SI via pitch 192 may be approximately equal to or less than a diameter of the signal via 140.

In an exemplary embodiment, the pair anti-pad 160 is oval-shaped or racetrack shaped. The pair anti-pad 160 includes a first end 200 and a second end 202 opposite the first end 200. The pair anti-pad 160 includes a first side 204 and a second side 206 opposite the first side 204. The signal traces 136 extend from the pair anti-pad 160 at the first side 204 through the gap 174. The first and second sides 204, 206 extend between the first and second ends 200, 202. In an exemplary embodiment, the first and second ends 200, 202 are curved. The first side 204 and/or the second side 206 may be linear between the curved ends 200, 202.

In an exemplary embodiment, the printed circuit board 100 includes a plurality of SI vias 176 along the first end 200. In an exemplary embodiment, the printed circuit board 100 includes a plurality of SI vias 176 along the second end 202. In an exemplary embodiment, the printed circuit board 100 includes a plurality of SI vias 176 along the first side 204. In an exemplary embodiment, the printed circuit board 100 includes a plurality of SI vias 176 along the second side 206. In various embodiments, at least three of the SI vias 176 are arranged along the first end 200 and at least three of the SI vias 176 are arranged along the second end 202. In various embodiments, at least three of the SI vias 176 are arranged along the second side 206.

In an exemplary embodiment, the SI vias 176 substantially surround the pair anti-pad 160 forming a shield fence around the edge 162. In an exemplary embodiment, the pair anti-pad 160 may have at least eight SI vias 176 around the edge 162. The SI vias 176 surround the pair anti-pad 160 everywhere except for the gap 174. In an exemplary embodiment, the edge 162 of the pair anti-pad 160 is spaced from the signal vias 140 by an anti-pad distance 210. The SI vias 176 are at the edge 162 such that the SI vias 176 are separated from the signal vias 140 by the anti-pad distance 210. In an exemplary embodiment, the ground vias 150 are spaced apart from the pair anti-pads 160. For example, the ground vias 150 are located a ground via distance 212 from the signal vias 140, where the ground via distance 212 is greater than the anti-pad distance 210. In various embodiments, the ground via distance 212 may be at least twice the anti-pad distance 210.

In an exemplary embodiment, the SI vias 176 are offset from each other by an angular offset 220, which is measured from the mid-point between the signal vias 140. The angular offset 220a at the gap 174 is the largest angular offset. In the illustrated embodiment, the angular offset 220a at the gap 174 is approximately 75°. The SI vias 176 are provided at small intervals around the remaining 285° around the anti-pad 160. In the illustrated embodiment, two other angular offsets 220b, 220c are illustrated. The angular offsets 220b, 220c are less than 45°. The angular offsets 220b, 220c may be less than 30°. Optionally, the angular offsets 220b, 220c may be less than 20°. The angle of the angular offsets 220 may be based on the number of SI vias 176 and the width of the gap 174. Optionally, the angular offsets 220 (except for the angular offset 220a at the gap 174) may be approximately equal to each other; however, some angular offsets 220 may be smaller and other angular offsets may be larger than others. In an exemplary embodiment, a majority of the angular offsets 220 are less than 25°.

In an exemplary embodiment, the signal traces 136 have trace widths 230. The signal vias 140 have diameters 232 that are larger than the trace widths 230. For example, the diameters 232 may be approximately three times the trace widths 230. In an exemplary embodiment, the ends of the signal traces 136 are tapered from the diameters 232 to the main portions having the trace widths 230. For example, the ends of the signal traces 136 may be tulip shaped.

A circuit board footprint design is provided providing good electrical performance for high speed data communication systems. For example, the circuit board footprint design performs will up to a desired cut-off frequency (for example, up to 60 GHz). The circuit board footprint design allows high speed signaling, such as up to 224 Gbps. The circuit board has signal vias set up in pairs and utilizes a pair anti-pad that is oval shaped to surround the pair of signal vias. The SI vias are arrayed to substantially surround the pair anti-pad. With the inclusion of the SI vias surrounding the pair anti-pad, a manufacturable circuit board footprint is created without the use of special PCB manufacturing processes. SI performance beyond 60 GHz is possible with the inclusion of the closely coupled SI vias.

Figure 4:
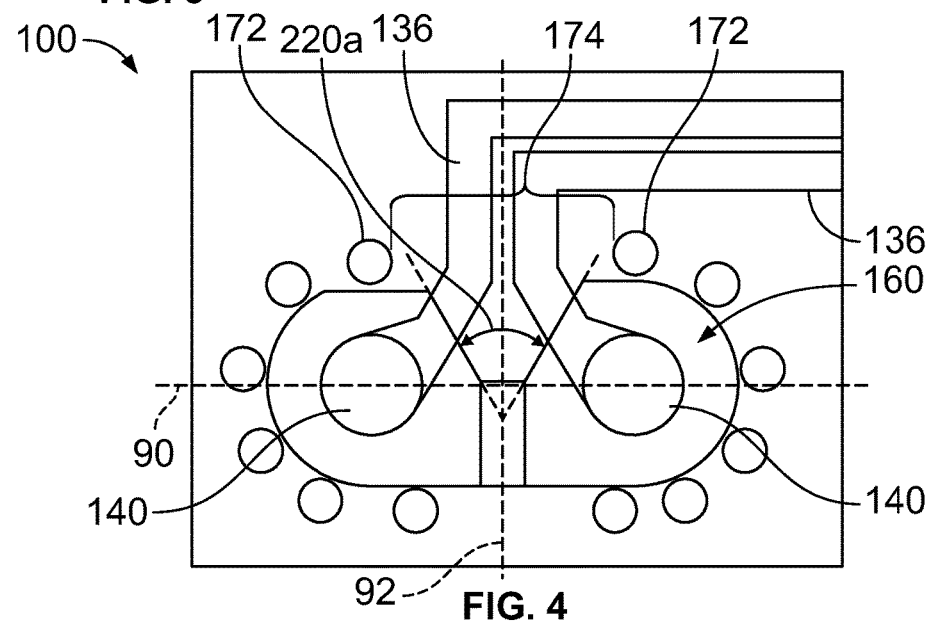
FIG. 4 is a top view of a portion of the printed circuit board in accordance with an exemplary embodiment.

FIG. 4 is a top view of a portion of the printed circuit board 100 in accordance with an exemplary embodiment. In the illustrated embodiment, the signal vias 140 are oriented differently than the embodiment shown in FIG. 3. The signal pair axis 94 is oriented parallel to the primary axis 90. The signal traces 136 exit the pair anti-pad 160 in a direction generally parallel to the secondary axis 92. Optionally, the gap 174 may be narrower (for example, the SI vias 172 more tightly arranged around the signal vias 140 and the signal traces 136) and the angular offset 220a may be smaller due to the symmetric arrangement with the signal traces 136 exiting along the secondary axis 92 compared to an embodiment having the signal traces exiting at an angle relative to the axes 90, 92.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A printed circuit board comprising:
a layered substrate having a plurality of layers including a top layer, a bottom layer, and at least one middle layer, the layered substrate having an electrical connector footprint configured to receive an electrical connector;
pair anti-pads passing through the layered substrate;
signal vias passing through the layered substrate, the signal vias configured to receive signal pins of the electrical connector, the signal vias arranged in pairs, the pairs of signal vias located in corresponding pair anti-pads;
ground vias passing through the layered substrate, the ground vias configured to receive ground pins of the electrical connector, the ground vias located outside of the pair anti-pads;
SI vias passing through the layered substrate, the SI vias forming an SI fence surrounding the corresponding pair anti-pad.

2. The printed circuit board of claim 1, wherein the SI vias substantially surround the corresponding pair anti-pads.

3. The printed circuit board of claim 1, wherein the SI vias are located at an edge of the corresponding pair anti-pad.

4. The printed circuit board of claim 1, wherein the SI fence includes a gap, signal traces extend from the signal vias through the gap.

5. The printed circuit board of claim 1, wherein the SI vias have an average SI via-SI via pitch between adjacent SI vias, and wherein the SI vias have an average SI via-signal via spacing between the SI vias and the nearest signal via, the average SI via-SI via pitch being less than the average SI via-signal via spacing.

6. The printed circuit board of claim 5, wherein the average SI via-signal via spacing is at least twice the average SI via-SI via pitch.

7. The printed circuit board of claim 1, wherein a majority of the SI vias have an angular offset of less than 25°.

8. The printed circuit board of claim 1, wherein the pair anti-pad is oval-shaped having a first end, a second end opposite the first end, a first side extending between the first and second ends, and a second side opposite the first side, the first and second ends being curved, wherein at least three of the SI vias are arranged along the first end and at least three of the SI vias are arranged along the second end.

9. The printed circuit board of claim 8, wherein signal traces extend from the signal vias and pass through the first side of the pair anti-pad, wherein at least three of the SI vias are arranged along the second side.

10. The printed circuit board of claim 1, further comprising signal traces extending from the signal vias, the signal traces having a trace width, the signal traces being tapered from the trace width to a diameter of the signal via.

11. The printed circuit board of claim 1, wherein an edge of the pair anti-pad is spaced from the signal vias by an anti-pad distance, the SI vias being separated from the signal vias by the anti-pad distance.

12. The printed circuit board of claim 1, wherein the ground vias are spaced apart from the pair anti-pads.

13. The printed circuit board of claim 1, wherein each pair anti-pad includes at least eight SI vias around an edge of the pair anti-pad.

14. The printed circuit board of claim 1, wherein the SI vias are positioned a first distance from the signal vias and the ground vias are positioned a second distance from the signal vias, the first distance being less than the second distance.

15. A printed circuit board comprising:
    a layered substrate having a plurality of layers including a top layer, a bottom layer, and at least one middle layer, the layered substrate having an electrical connector footprint configured to receive an electrical connector;
    pair anti-pads passing through the layered substrate;
    signal vias passing through the layered substrate, the signal vias configured to receive signal pins of the electrical connector, the signal vias arranged in pairs, the pairs of signal vias located in corresponding pair anti-pads;
    ground vias passing through the layered substrate, the ground vias configured to receive ground pins of the electrical connector, the ground vias located outside of the pair anti-pads;
    SI vias passing through the layered substrate, the SI vias forming an SI fence surrounding the corresponding pair anti-pad, wherein the SI vias have an average SI via-SI via pitch between adjacent SI vias and the SI vias have an average SI via-signal via spacing between the SI via and the nearest signal via, the average SI via-signal via spacing is greater than the average SI via-SI via pitch.

16. The printed circuit board of claim 15, wherein the SI vias are located at an edge of the corresponding pair anti-pad and substantially surround the corresponding pair anti-pads.

17. The printed circuit board of claim 15, wherein a majority of the SI vias have an angular offset of less than 15°.

18. The printed circuit board of claim 15, wherein the pair anti-pad is oval-shaped having a first end, a second end opposite the first end, a first side extending between the first and second ends, and a second side opposite the first side, the first and second ends being curved, wherein at least three of the SI vias are arranged along the first end and at least three of the SI vias are arranged along the second end.

19. The printed circuit board of claim 15, wherein the average SI via-signal via spacing is at least twice the average SI via-SI via pitch.

20. A printed circuit board comprising:
    a layered substrate having a plurality of layers including a top layer, a bottom layer, and at least one middle layer, the layered substrate having an electrical connector footprint configured to receive an electrical connector;
    pair anti-pads passing through the layered substrate, each pair anti-pad being oval-shaped having a first end, a second end opposite the first end, a first side extending between the first and second ends, and a second side opposite the first side, the first and second ends being curved;
    signal vias passing through the layered substrate, the signal vias configured to receive signal pins of the electrical connector, the signal vias arranged in pairs, the pairs of signal vias located in corresponding pair anti-pads;
    ground vias passing through the layered substrate, the ground vias configured to receive ground pins of the electrical connector, the ground vias located outside of the pair anti-pads;
    SI vias passing through the layered substrate, the SI vias forming an SI fence surrounding the corresponding pair anti-pad, wherein at least three of the SI vias are arranged along the first end of the corresponding pair anti-pad and at least three of the SI vias are arranged along the second end of the corresponding pair anti-pad.

* * * * *